(12) United States Patent
Hung et al.

(10) Patent No.: US 10,475,655 B2
(45) Date of Patent: Nov. 12, 2019

(54) SELECTIVE DEPOSITION OF METAL SILICIDES

(71) Applicants: Applied Materials, Inc., Santa Clara, CA (US); The Regents of the University of California, Oakland, CA (US)

(72) Inventors: Raymond Hung, Sunnyvale, CA (US); Namsung Kim, Sunnyvale, CA (US); Srinivas Nemani, Sunnyvale, CA (US); Ellie Yieh, Sunnyvale, CA (US); Jong Choi, San Diego, CA (US); Christopher Ahles, San Diego, CA (US); Andrew Kummel, San Diego, CA (US)

(73) Assignees: Applied Materials, Inc., Santa Clara, CA (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 15/988,820

(22) Filed: May 24, 2018

(65) Prior Publication Data
US 2018/0342395 A1    Nov. 29, 2018

Related U.S. Application Data

(60) Provisional application No. 62/511,521, filed on May 26, 2017.

(51) Int. Cl.
*H01L 21/44* (2006.01)
*H01L 21/285* (2006.01)
*H01L 21/324* (2006.01)

(52) U.S. Cl.
CPC .. *H01L 21/28518* (2013.01); *H01L 21/28562* (2013.01); *H01L 21/324* (2013.01)

(58) Field of Classification Search
CPC ......... H01L 21/28518; H01L 21/28562; H01L 28/324
USPC ......................................................... 438/664
See application file for complete search history.

(56) References Cited

U.S. PATENT DOCUMENTS

| | | |
|---|---|---|
| 7,135,418 B1 | 11/2006 | Papasouliotis |
| 9,034,773 B2 | 5/2015 | Thedjoisworo et al. |
| 2004/0102033 A1 | 5/2004 | Lu et al. |
| 2006/0210723 A1 | 9/2006 | Ishizaka |
| 2013/0189837 A1 | 7/2013 | Haukka et al. |
| 2017/0037513 A1 | 2/2017 | Haukka et al. |

OTHER PUBLICATIONS

International Search Report and Written Opinion dated Aug. 24, 2018 for Application No. PCT/US2018/034482.

(Continued)

*Primary Examiner* — David S Blum
(74) *Attorney, Agent, or Firm* — Patterson + Sheridan, LLP

(57) ABSTRACT

Embodiments of the disclosure relate to selective metal silicide deposition methods. In one embodiment, a substrate having a silicon containing surface is heated and the silicon containing surface is hydrogen terminated. The substrate is exposed to sequential cycles of a $MoF_6$ precursor and a $Si_2H_6$ precursor which is followed by an additional $Si_2H_6$ overdose exposure to selectively deposit a $MoSi_x$ material comprising $MoSi_2$ on the silicon containing surface of the substrate.

18 Claims, 10 Drawing Sheets

(56) References Cited

OTHER PUBLICATIONS

M. A. Chesters, J. Phys. Condens. Matter, 3, S251 (1991).
Kyungtae Lee, et al., Selective positioning of organic dyes in a; mesoporous inorganic oxide film, Nature Materials, 2009, 8, 8 pp.
Jin Xie, et al., Site-Selective Deposition of Twinned Platinum Nanoparticles on TiSi2 Nanonets by Atomic Layer Deposition and Their Oxygen Reduction Activities, 2013, 7 (7), 9 pp.
Woo-Hee Kim, et al., A Process for Topographically-Selective Deposition on 3D Nanostructures by Ion Implantation, ACS Nano, Mar. 7, 2016, 22 pp.
J. Alexander Liddle, et al., Nanomanufacturing: A Perspective, ACS Nano, 2016, 10 (3), 84 pp.
D. Kirillov, et al, Raman Scattering Study of Plasma Etching Damage in GaAs, Journal of Vacuum Science & Technology B: Microelectronics Processing and Phenomena 1986, 4, 3 pp.
C.-H. Jan, et al., A 22nm SoC Platform Technology Featuring 3-D Tri-Gate and High-k/Metal Gate, Optimized for Ultra Low Power, High Performance and High Density SoC Applications, 2012 International Electron Devices Meeting, 4 pp.
Ming Fang, et al., Area-Selective Atomic Layer Deposition: Conformal Coating, Subnanometer Thickness Control, and Smart Positioning, ACS Nano, 2015, 9 (9), 4 pp.
Mi H. Park, et al., Selective Atomic Layer Deposition of Titanium Oxide on Patterned Self-Assembled Monolayers Formed by Microcontact Printing. Langmuir, 2004, 20 (6), 4 pp.
Alfredo Mameli, et al., Area-Selective Atomic Layer Deposition of SiO2 Using Acetylacetone as a Chemoselective Inhibitor in an ABC-Type Cycle, ACS Nano 2017, 11, 9 pp.
Fatemeh Sadat Minaye Hashemi, et al., Self-Correcting Process for High Quality Patterning by Atomic Layer Deposition, ACS Nano, 2015, 9 (9) 8 pp.
Sarah E. Atanasov, et al, Inherent Substrate-dependent Growth Initiation and Selective-area Atomic Layer Deposition of TiO2 Using "Water-free" Metal-halide/metal Alkoxide Reactants, Journal of Vacuum Science and Technology A, Jan./Feb. 2016, 34 (1), 10 pp.
Marissa M. Kerrigan, et al, Substrate Selectivity in the Low Temperature Atomic Layer Deposition of Cobalt Metal Films from Bis(1,4-di-tert-butyl-1,3-diazadienyl)cobalt and Formic acid, The Journal of Chemical Physics 2017, 146, 9 pp.
Paul C. Lemaire, et al, Understanding Inherent Substrate Selectivity During Atomic Layer Deposition: Effect of Surface Preparation, Hydroxyl Density, and Metal Oxide Composition on Nucleation Mechanisms During Tungsten ALD, The Journal of Chemical Physics, 2017 146, 10 pp.
Berc Kalanyan, et al, Using Hydrogen To Expand the Inherent Substrate Selectivity Window During Tungsten Atomic Layer Deposition, Chemistry of Materials, 2016, 28, 10 pp.
A. H. Reader, et al, Transition Metal Silicides in Silicon Technology, Rep. Prog. Phys., 1992, 56, 72 pp.
S. P. Murarka, Transition Metal Silicides, Ann. Rev. Mater. Sci., 1983, 13, 22 pp.
M. Y. Tsai, et al, One?Micron Polycide (WSi2 on Poly?Si) MOSFET Technology, J. Electrochem. Soc. 1981, 128 (10), 8 pp.
D. Seghete, et al, Molybdenum Atomic Layer Deposition Using MoF6 and Si2H6 as the Reactants, Chem. Mater. 2011, 23, 11 pp.
Karla Bernal-Ramos, et al, Atomic Layer Deposition of Cobalt Silicide Thin Films Studied by in Situ Infrared Spectroscopy, Chem. Mater. 2015, 27, 7 pp.
Thomas Proslier, et al, Atomic Layer Deposition and Superconducting Properties of NbSi Films, J. Phys. Chem. C, 2011, 115 (19), 26 pp.
Y. J. Chabel, et al, Infrared Spectroscopy of Si(111) and Si(100) Surfaces After HF Treatment: Hydrogen Termination and Surface Morphology, J. Vac. Sci. Tehnology May/Jun. 1989, 7 (3), 6 pp.
J.W. Klaus, et al, Atomic Layer Deposition of Tungsten Using Sequential Surface Chemistry; with a Sacrificial Stripping Reaction, Thin Solid Films, 2000, 360, 9 pp.
E. K. Broadbent, et al, Selective Low Pressure Chemical Vapor Deposition of Tungsten, J. Electrochem. Soc. 1984 131 (6), 7 pp.
Kow Ming Chang, et al, Reduction of Selectivity Loss Probability on Dielectric Surface during Chemical Vapor Deposition of Tungsten Using Fluorinated Oxide and Removing Silanol Units on Dielectric Surface, Jpn. Appl. Phys., 1996, 35, 8 pp.
Deuk-Sung Choi, Fluorine Effects on NMOS Characteristics and DRAM Refresh, Journal of Semiconductor Technology and Science, Mar. 2012, 12 (1), 5 pp.
Yuichiro Mitani, et al, Improvement of Charge-to-Breakdown Distribution by Fluorine Incorporation Into Thin Gate Oxides, IEEE Transactions on Electron Devices, Nov. 2003, 50 (11), 6 pp.
Der-Gao Lin, et al, The Effect of Fluorine on MOSFET Channel Length, IEEE Electron Device Letters, Oct. 10, 1993, 14 (10), 3 pp.
Ph. Gouy-Pailler, et al, Selective Deposition of Tungsten by Chemical Vapour Deposition from SiH4 Reduction of WF6, Thin Solid Films, 1994, 241, 4 pp.
Roger Mueller, et al, OH Surface Density of SiO2 and TiO2 by Thermogravimetric Analysis, Langmuir 2003, 19, 6 pp.
Jinhee Kwon, et al, Substrate Selectivity of (tBu-Allyl)Co(CO)3 during Thermal Atomic Layer Deposition of Cobalt, Chem. Mater. 2012, 24, 6 pp.

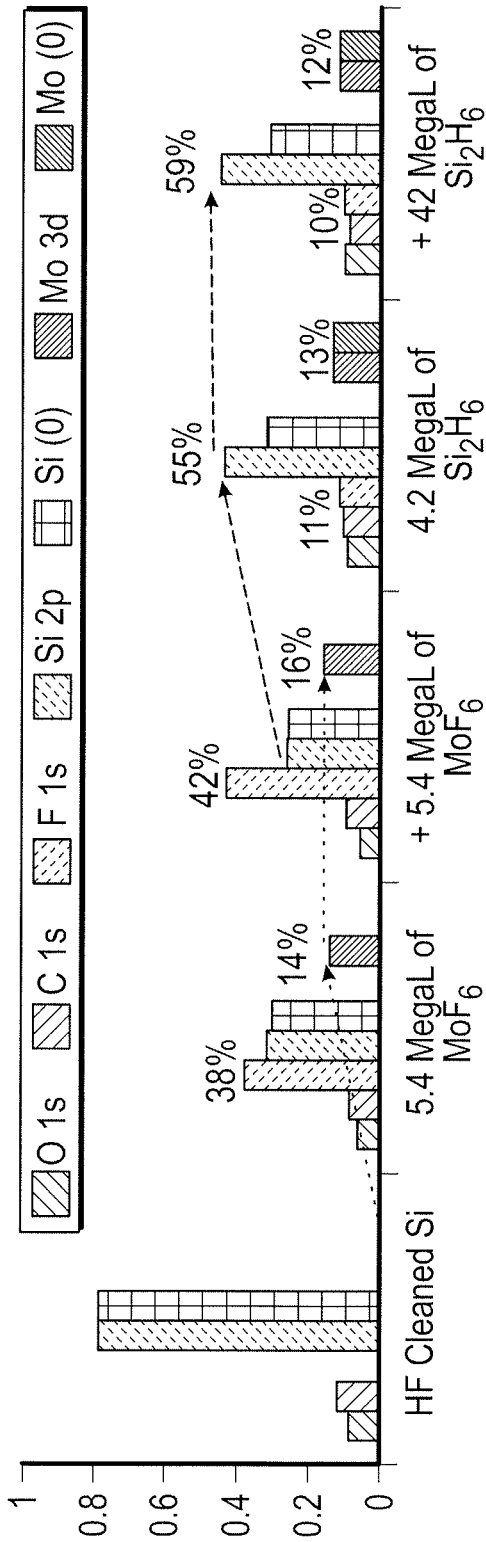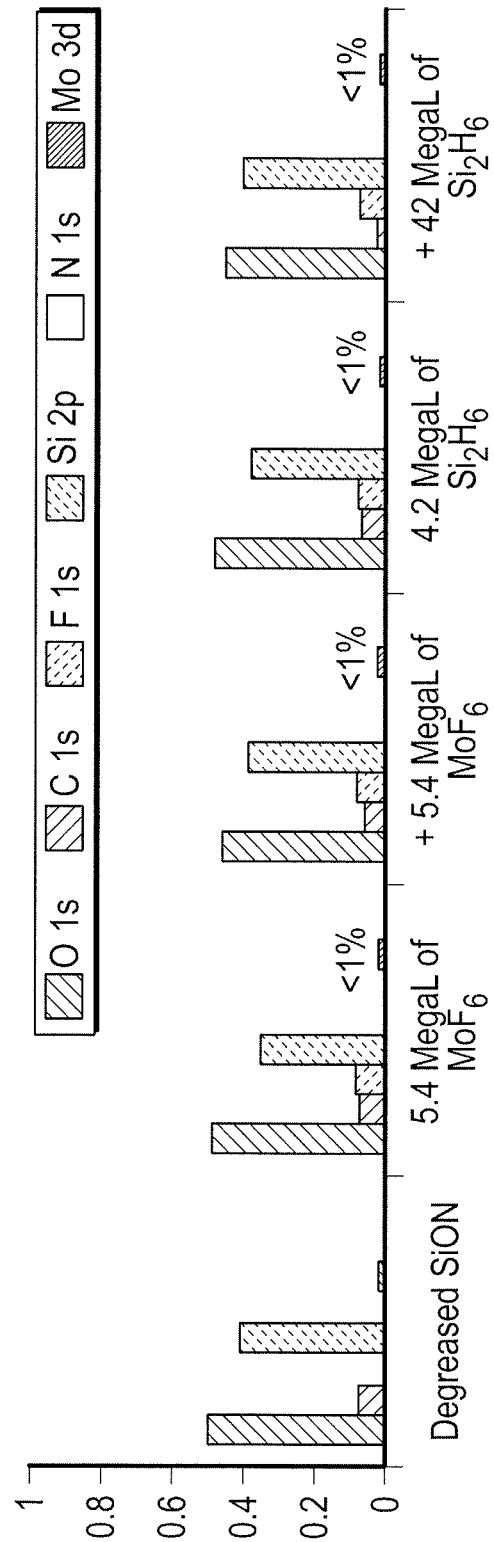
FIG. 1A
FIG. 1B

SELECTIVE DEPOSITION OF METAL SILICIDES

CROSS-REFERENCE TO RELATED APPLICATIONS

This application claims benefit of U.S. provisional patent application Ser. No. 62/511,521, filed May 26, 2017, the entirety of which is herein incorporated by reference.

BACKGROUND

Field

Embodiments of the present disclosure generally relate to methods for metal silicide deposition.

Description of the Related Art

Accurate positioning of materials on nanoscale devices is critical for manipulation of atomic-scale properties for next-generation nanoelectronics. For semiconductor fabrication, detailed positioning of materials with excellent conformality and stoichiometry is utilized to meet demand for cost, yield, and throughput. As metal-oxide-semiconductor field effect transistors (MOSFETs) are scaled to less than <10 nm channel length, there it is desirable to overcome the constraints originating from top-down processes, such as damage from reactive ion etching and structural complexity in structure alignment on three-dimension (3D) surfaces.

Recently, as MOSFET devices have been fabricated in 3D structures (FinFETs), there has been increasing interest in nanoscale area-selective deposition while maintaining conformal film quality. One approach to area-selective deposition is the utilization of self-assembled monolayers (SAMs) as passivation layers in combination with atomic layer deposition (ALD) processes. The passivation layers block or eliminate surface functional groups that are reactive towards ALD precursors so that selectivity can be obtained; however, the SAMs approach still utilizes selective deposition of the passivation layer. Furthermore, the passivation layers are selectively removed after the selective deposition which necessitates additional process complexity and reduced throughput.

Thus, what is needed in the art are improved methods for selective material deposition.

SUMMARY

In one embodiment, a substrate processing method is provided. The method includes heating a substrate having a silicon containing surface to a first temperature, exposing the substrate to a plasma comprising hydrogen, exposing the substrate to a first dosage of a $MoF_6$ precursor, and exposing the substrate to a second dosage of a $Si_2H_6$ precursor. The exposing the substrate to a first dosage and the exposing the substrate to a second dosage is sequentially cycled and after the sequential cycling, the substrate is exposed to a third dosage of the $Si_2H_6$ precursor.

In another embodiment, a substrate processing method is provided. The method includes positioning a substrate on a heater in a reaction chamber having chamber walls, heating the substrate on the heater to a first temperature, maintaining the chamber walls at a second temperature less than the first temperature, and exposing a silicon containing surface of the substrate to hydrogen. The substrate is exposed to a first dosage of a $MoF_6$ precursor, the substrate is exposed to a second dosage of a $Si_2H_6$ precursor, the exposing the substrate to a first dosage and the exposing the substrate to a second dosage is sequentially cycled, and after the sequential cycling, the substrate is exposed to a third dosage of the $Si_2H_6$ precursor.

In yet another embodiment, a substrate processing method is provided. The method includes heating a substrate to a first temperature, exposing a silicon containing surface of the substrate to a hydrogen containing plasma, exposing the substrate to a first dosage of a $MoF_6$ precursor, and exposing the substrate to a second dosage of a $Si_2H_6$ precursor. The exposing the substrate to a first dosage and the exposing the substrate to a second dosage is sequentially cycled, after the sequential cycling, the substrate is exposed to a third dosage of the $Si_2H_6$ precursor, and the substrate is annealed after the exposing the substrate to a third dosage at a second temperature of between about 500° C. and about 550° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1A illustrates X-ray photoelectron spectroscopy (XPS) data of $MoSi_x$ film selectivity on a silicon substrate according to an embodiment described herein.

FIG. 1B illustrate XPS data of $MoSi_x$ film selectivity on a silicon oxynitride substrate according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2A:
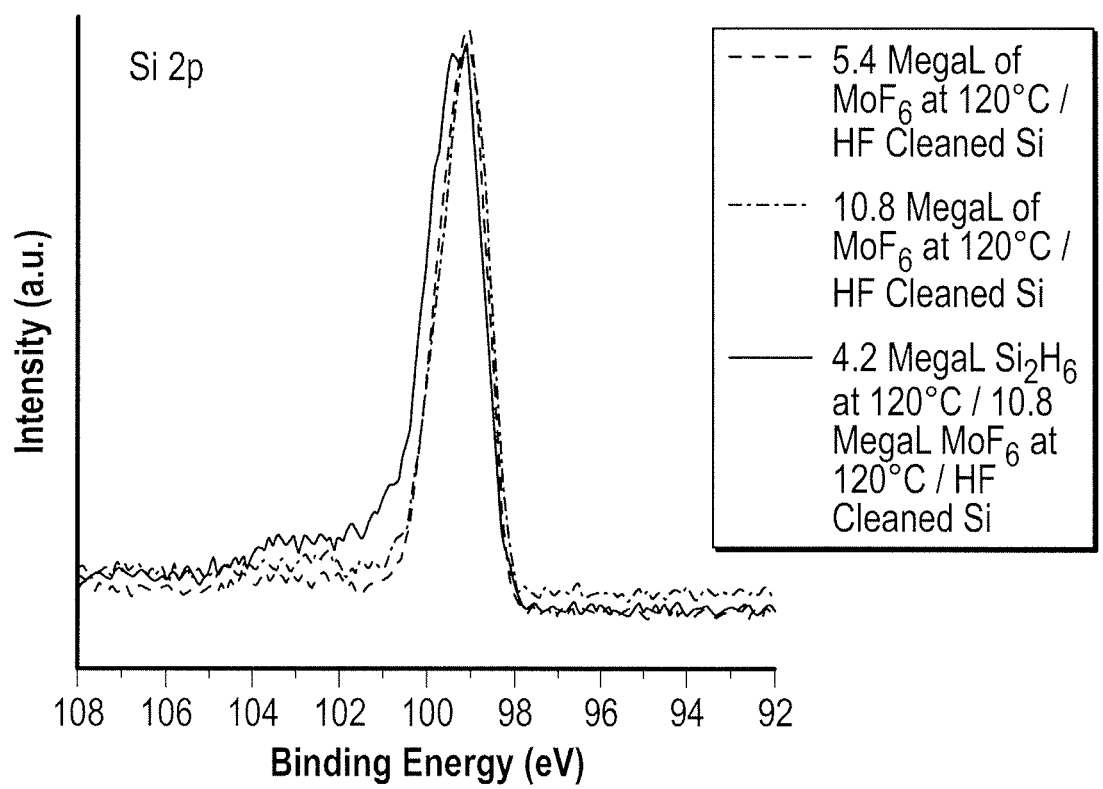
FIG. 2A illustrates XPS oxidation state data of Si and Mo on a silicon substrate according to an embodiment described herein.

Embodiments described herein include methods which utilize substrate-dependent reactivity of ALD precursors for area-selective deposition. More specifically, embodiments of the disclosure relate to selective deposition of $MoSi_x$ on Si preferentially to $SiO_2$, SiON and $SiN_x$ using substrate selectivity of $MoF_6$ and $Si_2H_6$. To achieve a stoichiometric $MoSi_2$ film, additional Si incorporation into the film after the $MoF_6$ and $Si_2H_6$ ALD cycles was performed by dosing $Si_2H_6$ onto a Mo rich $MoSi_x$ film.

Highly selective deposition of $MoSi_x$ on Si preferentially to $SiO_2$ and $SiN_x$ was achieved via atomic layer deposition (ALD) using $MoF_6$ and $Si_2H_6$ precursors at a temperature of about 120° C. Deposition selectivity was enabled by the lack of chemical reactivity between the reactants ($MoF_6$ and $Si_2H_6$) and $SiO_2$ and $SiN_x$ containing substrates. In contrast, $MoF_6$ nucleated in a self-limiting manner on H-terminated Si, and a subsequent $Si_2H_6$ exposure reduced $MoF_x$ to $Mo^0$ which is consistent with Mo—Si bond formation.

X-Ray photoelectron spectroscopy (XPS) revealed that 5 ALD cycles of $MoF_6$ and $Si_2H_6$ selectively deposited a sub-stoichiometric $MoSi_2$ film on the Si substrate. In the ALD process, the $MoF_6$ and $Si_2H_6$ precursors were sequentially cycled in a repeating manner with a purge between each successive precursor exposure. Additional $Si_2H_6$ doses on the sub-stoichiometric $MoSi_2$ film incorporated more Si into the film without disturbing the deposition selectivity over $SiO_2$ and $SiN_x$. In one embodiment, a bulk of the $MoSi_x$ film has a ratio of Si:Mo between about 1.7 and about 1.9 with less than about 10% F and O impurities. Embodiments described herein are believed to be advantageous over conventional high pressure Si ALD cycles for the formation of silicide materials, for example, in the formation of source/drain contact structures.

Deposition selectivity of $MoSi_x$ was analyzed, according to the embodiments described herein, on a patterned Si substrate containing three-dimensional (3D) nanoscale $SiO_2$ and $SiN_x$ features. Cross-sectional transmission electron microscopy (TEM) indicated that selective $MoSi_x$ deposition was achieved on nanoscale 3D structures. In one embodiment, less than about 10 nuclei/$\mu m^2$ were present on $SiO_2$; since $SiO_2$ has approximately $A10^7/\mu m^2$ OH groups, this corresponds to a selectivity of about $10^7$:1 between the OH groups on $SiO_2$ and Si—H groups on Si. Thus, it is believed that substrate-dependent selectivity for silicide deposition enables the elimination of passivant (i.e. SAMs) utilization.

Experimental

Various substrate types were utilized for the $MoSi_x$ silicide formation processes described herein. Four types of substrates were utilized: P-type Si (100) (Boron-doped, available from Virginia Semiconductor, Fredericksburg, Va.), thermally grown $SiO_2$ on Si (100) (available from University Wafer, South Boston, Mass.), SiON (available from Applied Materials, Inc., Santa Clara, Calif.) and patterned substrates having Si, $SiO_2$, and $SiN_x$ material surfaces on a single substrate. The SiON (silicon oxynitride) in described herein is $Si_3N_4$, unless otherwise noted, which has been subjected to reactive ion etching and plasma ashing in oxygen during fabrication. Thus, the SiON substrate contains oxygen which is similar to the conditions of $Si_3N_4$ after processing in integrated 3D nanoscale devices.

The substrates were diced into 12 mm×3 mm pieces and degreased with acetone, methanol, and deionized (DI) $H_2O$. The native oxide on Si was removed by immersing the degreased substrates into a 0.5% HF(aq) solution for 30 seconds. For consistency in cleaning procedure, the $SiO_2$, SiON, and patterned substrates were subjected to the same cleaning procedure. It is also contemplated that a plasma based native oxide removal process may be utilized. For example, an $NF_3/H_2$ and/or $NF_3NH_3$ plasma cleaning process may be utilized to clean and hydrogen terminate a silicon containing surface of the substrates. On SiON substrates, the $NF_3$ plasma treatment is believed to prevent or substantially reduce deposition selectivity loss by passivating active hydroxyl nucleation sites. In certain embodiments, the native oxide removal process is the SICONI® pre-clean process available from Applied Materials, Inc., Santa Clara, Calif.

The substrates were blow-dried using high purity $N_2$ gas. The Si, $SiO_2$, SiON, and patterned substrate were loaded together on a single substrate holder to expose the substrates to the same ALD conditions. The substrates were loaded into a load lock chamber pumped by a turbo molecular pump and backed by a mechanical pump. The base pressure of the load lock was about $2.0 \times 10^{-7}$ Torr. Subsequently, the substrates were transferred in-situ to an ultra-high vacuum chamber with a base pressure of about $3.0 \times 10^{-10}$ Torr pumped by an ion pump and titanium sublimation pump. The ultra-high vacuum chamber was equipped with a monochromatic XPS apparatus (XM 1000 MkII/SPHERA, available from Scienta Omicron, Inc., Denver, Colo.), a scanning tunneling microscope (STM) (available from Scienta Omicron, Inc., Denver, Colo.), and annealing system using a pyrolytic boron nitride (PBN) heater.

The substrates were first annealed at 120° C. in the ultra-high vacuum chamber and the chemical composition of the substrates were determined using XPS. The substrates were transferred in-situ to a reaction chamber having a base pressure of about $5.0 \times 10^{-7}$ Torr. For $MoSi_x$ deposition, $MoF_6$ (99% purity, available from Synquest Laboratories, Alachua, Fla.) and $Si_2H_6$ (99.99% purity, available from Air Liquide USA, LLC, Houston, Tex.) precursors were employed.

During the ALD cycles, a constant purge of $N_2$ (80 mTorr) was used, and the pressure of this purge was controlled using a leak valve. The $MoF_6$ and $Si_2H_6$ doses were regulated using pneumatic valves controlled by LabView software (available from National Instruments, Austin, Tex.). An expansion volume was employed for the MoF$_6$ and Si$_2$H$_6$ doses. Utilization of the expansion volume includes filling a secondary volume with MoF$_6$ or Si$_2$H$_6$ and dosing the precursors from their respective secondary volumes. The fill time for the MoF$_6$ was between about 10 ms and about 10 ms, such as about 40 ms. The dose time for the MoF$_6$ was between about 10 ms and about 100 ms, such as about 50 ms. The fill time for the Si$_2$H$_6$ was between about 1 ms and about 50 ms, such as about 18 ms. The dose time for the Si$_2$H$_6$ was between about 1 ms and aboutg 50 ms, such as about 18 ms.

The exposures of MoF$_6$ and Si$_2$H$_6$ were calculated in terms of Langmuirs (L) where 1 L=1×10$^{-6}$ Torr×1 sec. The pressure spikes during the exposures were monitored using a convectron gauge in the reaction chamber. The doses were about 1.8 MegaL for MoF$_6$ and about 4.2 MegaL for Si$_2$H$_6$ with a 2-minute wait time between the doses. The substrates were heated using the PBN heater, and the temperature was maintained at a temperature of between about 100° C. and about 150° C., such as about 120° C. The chamber walls were maintained at a temperature of between about 65° C. and about 85° C. In one embodiment, the MoF$_6$ doses were between about 1.0 MegaL and about 10 MegaL. In another embodiment, the Si$_2$H$_6$ doses were between about 1.0 MegaL and about 10 MegaL.

After the deposition cycles, the substrates were transferred in-situ to the ultra-high vacuum chamber for XPS and STM analysis. For the XPS measurement, the X-rays were generated by an Al Kα anode (1486.7 eV). XPS data was acquired using constant analyzer-energy (CAE) with a step width of 0.1 eV and a pass energy of 50 eV. The XPS detector was positioned at 60° to the substrate normal (30° take-off angle from the substrate surface) with a detector-acceptance angle of 7°. XPS spectra were analyzed after correcting each peak area with its respective relative sensitivity factor using a Casa XPS v.2.3 program. All of the chemical components in this work were normalized to the sum of all components. Scanning tunnel microscopy was performed with a substrate bias of −1.8 V and a constant current of 200 pA.

To investigate the elemental composition of the bulk of the film, Ar$^+$ sputtering was performed in conjunction with XPS. A lens voltage of 5 kV with a beam current of 1.2 μA at 6.0×10$^{-7}$ Torr of Ar was employed; since a raster was used to cover the full substrate area, the current density was approximately 1.2 uA/50 mm$^2$. The MoSi$_x$ substrate was maintained at 25° C. during sputtering to minimize any thermal desorption.

Results

FIG. 1A illustrates data of the XPS chemical composition of the HF cleaned Si surface before and after sequential doses of MoF$_6$ and Si$_2$H$_6$ at 120° C. Two sets of 5.4 MegaL MoF$_6$ were dosed on a HF cleaned Si substrate at 120° C. XPS showed saturation of Mo at 16%. Afterward, 4.2 Si$_2$H$_6$ MegaL and an additional 42 MegaL of Si$_2$H$_6$ were dosed onto the MoF$_6$-saturated Si surface at 120° C. resulting in Si being saturated at 59%. In one embodiment, the MoF$_6$ was dosed between about 1 MegaL and about 10 MegaL. In another embodiment, the SI$_2$H$_6$ was dosed between about 1 MegaL and about 10 MegaL. In another embodiment, the additional Si$_2$H$_6$ dose was between about 20 MegaL and about 50 MegaL.

After the HF clean, all the Si was in an oxidation state of 0 with 9% O and 12% C contamination. The contamination is believed to be caused by adventitious hydrocarbon adsorption during the substrate transfer into vacuum. HF(aq) was utilized to eliminate native oxide on Si and leaves the Si surface H-terminated. It should be noted that the Si 2p data in FIG. 1 indicates the total amount of Si while the Si (0) data indicates the amount of Si which is in an oxidation state of 0.

After the 5.4 MegaL of MoF$_6$ at 120° C., 14% Mo and 38% F were deposited on the HF cleaned Si surface. After an additional 5.4 MegaL of MoF$_6$ at 120° C. were dosed, the Mo concentration increased from 14% to 16% and the F concentration increased from 38% to 42%. This small increase in Mo and F content after an additional 5.4 MegaL of MoF$_6$ shows that the reaction of MoF$_6$ on HF cleaned Si is self-limiting. After the Si surface was saturated with MoF$_x$, the ratio of F/Mo was 2.6 and all of the Si was in an oxidation state of 0. Sequential doses of 4.2 MegaL of Si$_2$H$_6$ and 42 MegaL of Si$_2$H$_6$ indicate that the Si$_2$H$_6$ reaction also saturates on the MoF$_x$ covered Si surface. It is believed that with a thicker sub-stoichiometric MoSi$_2$ film, additional Si can be incorporated onto the surface. However, the Si$_2$H$_6$ reacts in a self-limiting manner on a thinner (monolayer) film of Mo.

After saturation of Si$_2$H$_6$, the Si content was 59% and F decreased to 10%. Since the substrate is Si, this increase of the Si content after dosing Si$_2$H$_6$ could be partially ascribed to the substrate since F desorption occurred. However, attenuation of the Mo after Si$_2$H$_6$ dosing was observed which is consistent with the deposition of Si. The reaction of MoF$_6$ and Si$_2$H$_6$ on H-terminated Si demonstrates the potential for MoSi$_x$ ALD on Si—H terminated Si.

FIG. 1B illustrates XPS chemical composition data for the same series of MoF$_6$ and Si$_2$H$_6$ saturation doses described above with regard to FIG. 1A but on a SiON substrate. As illustrated, no reaction was observed. It should be noted that while the SiON substrate was nominally SiON, XPS showed only negligible amounts of N on the surface and so this substrate is mostly ion damaged SiO$_x$. After the first 3 pulses of MoF$_6$, 8% F and negligible Mo (<1%) were observed. For the rest of the saturation doses, the SiON surface remained unreactive to both MoF$_6$ and Si$_2$H$_6$. While the SiON used in this study is ion damaged, the Si is in oxidation states of +3 and +4 and the data is consistent with the strong Si—O, Si—N, SiO—H bonds, thus substantially precluding the Si from forming bonds to Mo.

Figure 2B:
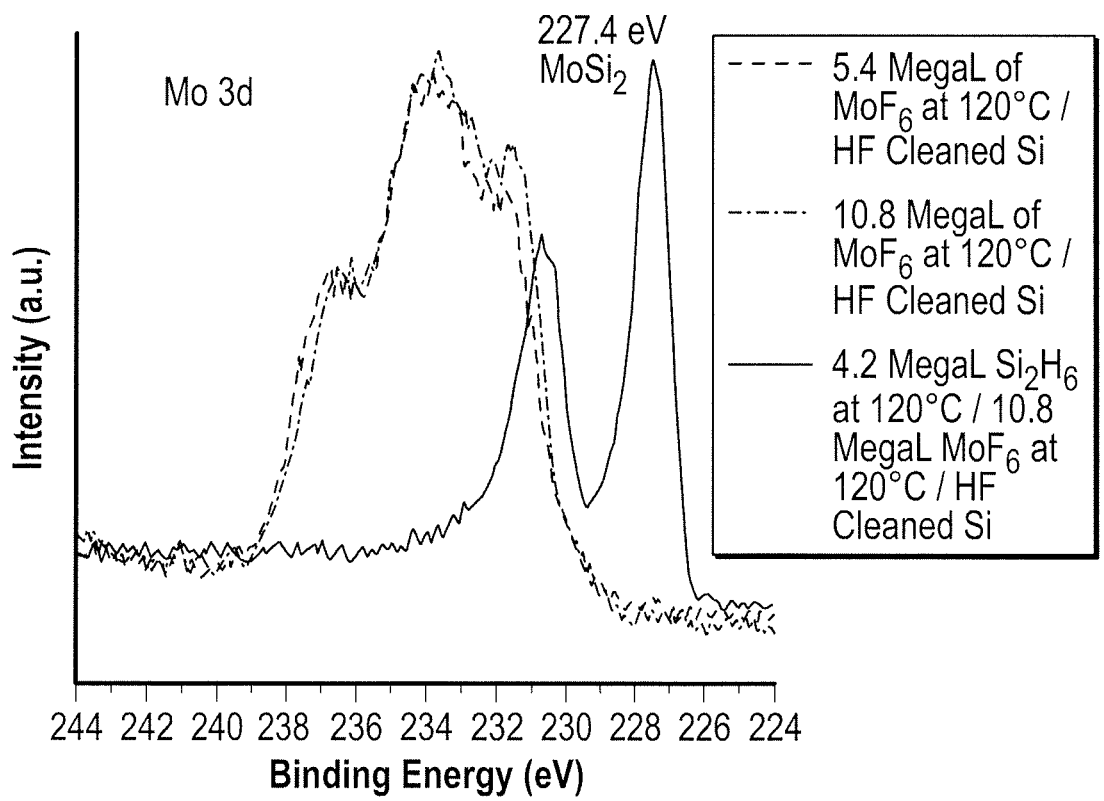
FIG. 2B illustrates XPS oxidation state data of Si and Mo on a silicon substrate according to an embodiment described herein.

FIGS. 2A and 2B illustrates XPS spectra of Si 2p and Mo 3d for the HF cleaned Si substrate are shown to compare the oxidation states at each experimental operation. FIG. 2A illustrates Si 2p peaks after sequential MoF$_6$ and S$_2$H$_6$ doses show that Si remained in oxidation state of 0 after the 10.8 MegaL of MoF$_6$ at 120° C. (blue line) which is consistent with Mo—Si bond formation and no etching of Si by F. After the 4.2 MegaL Si$_2$H$_6$ dose at 120° C. (red line), most of the Si stayed in an oxidation state of 0. This is consistent with the formation of a monolayer of MoSi$_2$. A small oxidized Si peak emerged at higher binding energies which might be SiH$_x$F$_{4-x}$, (x=2 or 3) or SiO$_x$ at the surface. FIG. 2B illustrates Mo 3d peaks after sequential MoF$_6$ and S$_2$H$_6$ doses shows that the Mo 3d peaks existed in multiple oxidation states after the saturation dose of MoF$_6$ (black and blue line). After a Si$_2$H$_6$ dose (red line), all of the Mo was reduced and the peak was centered at 227.4 eV which is consistent with MoSi$_2$ formation.

After the first 5.4 MegaL of MoF$_6$, the Si 2p peak remained at an oxidation state of 0 which is consistent with Si—Mo bond formation. The Mo 3d peaks appeared at multiple oxidation states which indicates that the surface species are MoF$_x$ with x=4, 5 and 6 (black line). The additional 5.4 MegaL of MoF$_6$ did not change the oxidation states of the Si 2p or the Mo 3d peaks (blue line). The data suggests formation of Si—Mo—$F_r$ at the surface. It is noted that the F/Mo ratio was 2.6 after the $MoF_6$ saturation dose (FIG. 1A XPS data) while the Mo is in oxidation states of 4-6; therefore, it is believed that there is some Mo—O bond formation. A small shoulder peak at a higher binding energy (103 eV) on the Si 2p XPS peak appeared after a 4.2 MegaL of $Si_2H_6$ dose (red line). This is consistent with Si—F or Si—O formation. The Mo 3d spectra shows that after a single $Si_2H_6$ dose, all of the Mo is reduced to $Mo^0$ with a binding energy of 227.4 eV. This is consistent with the formation of a monolayer of $MoSi_x$ and the transfer of any residual oxygen or fluorine from Mo to Si in the form of Si—O and Si—F bonds. A simplified reaction of $MoF_6$ and $Si_2H_6$ can be described as:

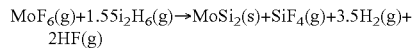

Figure 3A:
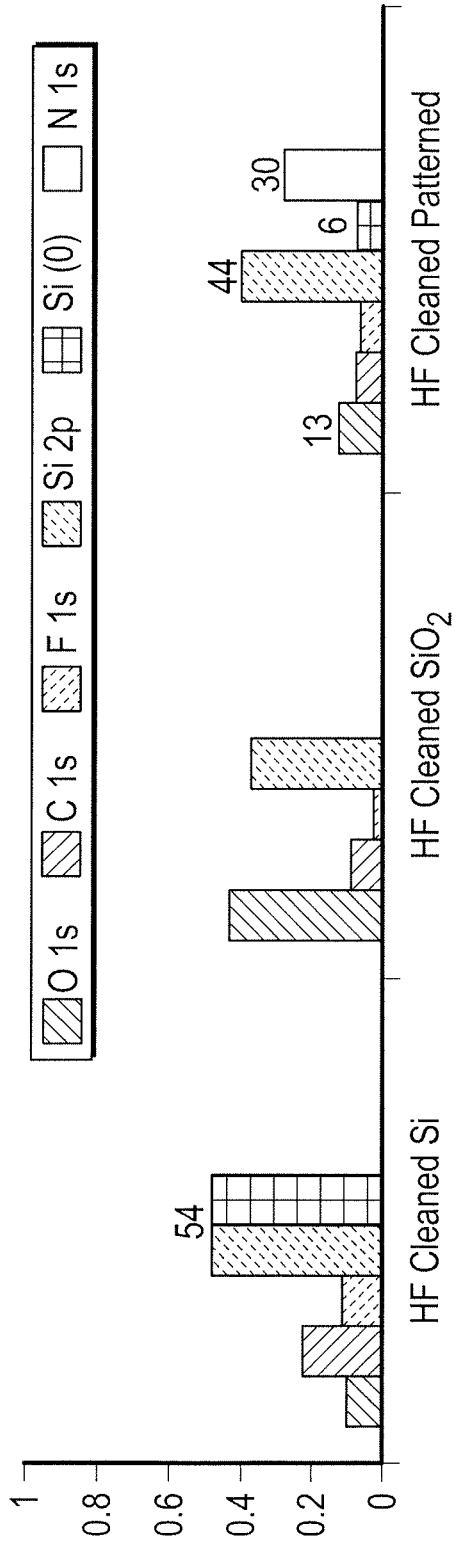
FIG. 3A illustrates XPS chemical composition data of various elements present on different substrate types prior to ALD processing according to an embodiment described herein.
Figure 3B:
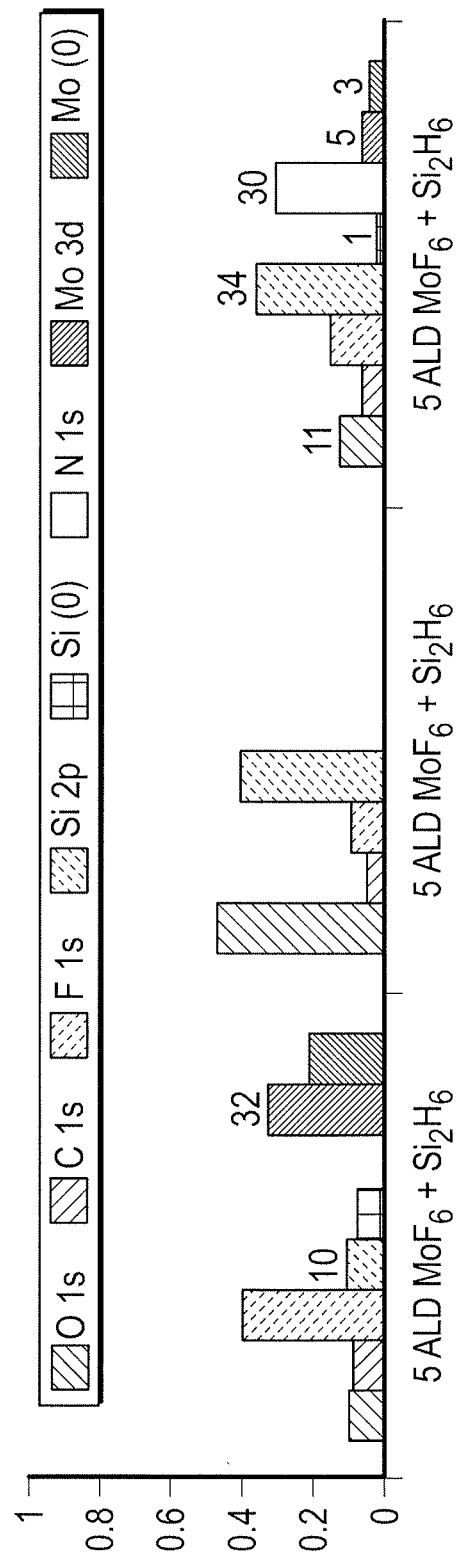
FIG. 3B illustrates XPS chemical composition data of various elements present on different substrate types after 5 ALD cycles according to an embodiment described herein.
Figure 3C:
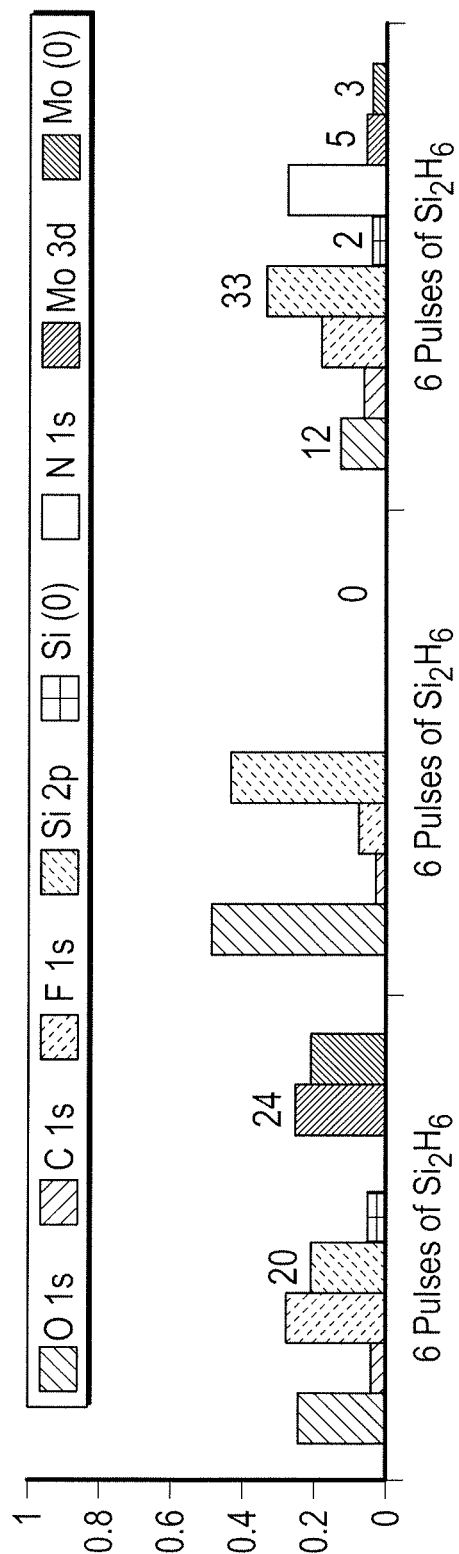
FIG. 3C illustrates XPS chemical composition data of various elements present on different substrate types after additional ALD cycles according to an embodiment described herein.

ALD characteristics of $MoSi_x$ on the Si substrate and the selectivity over the $SiO_2$ and $SiN_x$ substrates were verified via XPS of $MoSi_x$ deposition on a patterned substrate. FIG. 3A illustrates the chemical composition of a set of three substrates: HF cleaned Si, HF cleaned $SiO_2$, and HF cleaned patterned substrate. FIG. 3B illustrates the chemical composition of each of the FIG. 3A substrates after 5 ALD cycles of $MoF_6$ and $Si_2H_6$ at 120° C. The data indicated that a Si-deficient $MoSi_x$ was selectively deposited on Si and not on $SiO_2$. The $Si^0$ component of the patterned sample was also selectively attenuated by the $MoSi_x$ deposition. FIG. 3C illustrates the chemical composition of each of the FIG. 3B substrates after an additional 25.2 MegaL (between 3 pulses and 10 pulses) of $Si_2H_6$. The additional $Si_2H_6$ incorporated Si onto the $MoSi_x$ surface. Selectivity with respect to $SiO_2$ was maintained during the additional $Si_2H_6$ pulses ($SiO_2$ had 0% Mo and 0% $Si^0$ throughout the ALD process).

The three substrates were loaded together on a single substrate holder to ensure that they were exposed to identical deposition conditions. The Si and $SiO_2$ substrates allowed verification of selectivity during deposition on the patterned substrate. The patterned substrate has $SiO_2$ layers sandwiched by $SiN_x$ on top of the Si substrate. It is noted that the $SiN_x$ on the patterned substrate was actually SiON since it was ion damaged and ashed in $O_2$ during fabrication. As shown in FIG. 3A, a 30 s HF clean removed the native oxide on Si. The thermally grown $SiO_2$ was 300 nm thick and the 30 s of HF clean did not change the elemental composition or oxidation states of $SiO_2$. The HF cleaned patterned substrate was composed of a mixture of $SiN_x$, $SiO_x$ and $Si^0$.

XPS was performed after 5 ALD cycles of $MoF_6$ and $Si_2H_6$ at 120° C. as shown in FIG. 3B. XPS showed a surface composition of 32% Mo and 10% Si on the Si substrate which corresponds to highly Si-deficient $MoSi_x$. There was no $MoSi_x$ deposition on the $SiO_2$ substrate consistent with highly selective ALD. On the patterned substrate, XPS showed that 5% Mo was deposited, and the $Si^0$ was attenuated to 1%. The fraction of N and O at the surface did not change significantly during ALD on the patterned substrate. The data is consistent with Si-deficient $MoSi_x$ being deposited selectivity on the 6% of $Si^0$ on the patterned substrate.

Deposition selectivity on the pattern substrates is consistent with three aspects of embodiments described herein: (1) $MoSi_x$ deposition on the Si substrate but not on the $SiO_2$ substrate. (2) After the $MoSi_x$ deposition, the $Si^0$ (not the higher oxidation state Si peaks from Si—N and Si—O) was attenuated on the pattered substrate. (3) Numerically, about 4% Mo deposition on the patterned substrate with 6% $Si^0$ is proportional to having 32% Mo on the Si substrate with 54% $Si^0$ on the HF clean surface.

Even though a monolayer of $MoSi_2$ was able to be deposited on Si in the ALD saturation experiments described in FIG. 1 and FIG. 2, consecutive ALD cycles did not produce stoichiometric $MoSi_2$. It is believed that the formation of Si deficient $MoSi_x$ is due to the surface Si—H species desorbing during the fluorosilane elimination process and to residual Mo—F bonds which are not readily removed by standard $Si_2H_6$ dosing. For the first 1-3 monolayers, there is an excess of Si from the substrate present to assist in fluorine desorption, but for thicker films, Mo—F surface bonds may persist since the only available Si is from the gaseous $Si_2H_6$. The overall fluorosilane elimination chemistry using $MoF_6$ and $Si_2H_6$ is consistent with one of two chemical reactions:

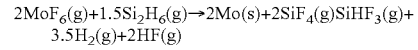

To form $MoSi_2$, the three substrates were exposed to an additional 25.2 MegaL (between 3 pulses and 10 pulses, such as 6 pulses) of $Si_2H_6$ at 120° C. (See FIG. 3C). After the additional $Si_2H_6$ exposure, Si increased to 20% on the Si substrate consistent with Si being incorporated into the film or on the surface of the substrate. The additional $Si_2H_6$ doses did not decrease the selectivity for deposition on Si versus $SiO_2$.

Figure 4A:
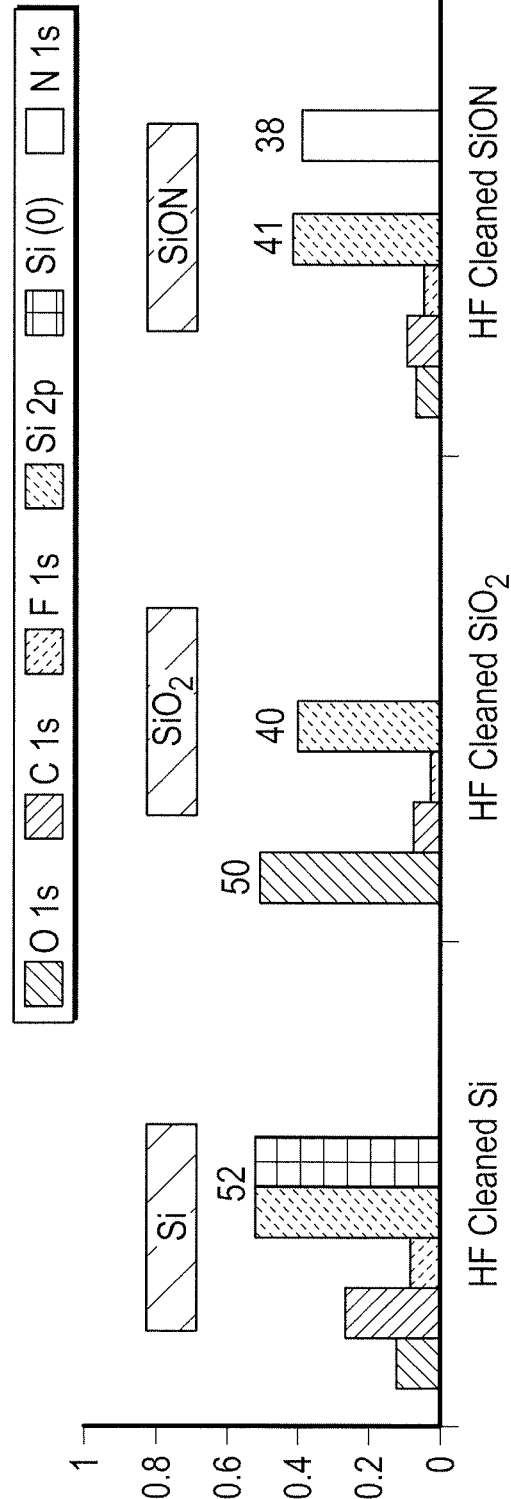
FIG. 4A illustrates XPS chemical composition data of various elements present on different substrate types prior to ALD processing according to an embodiment described herein.
Figure 4B:
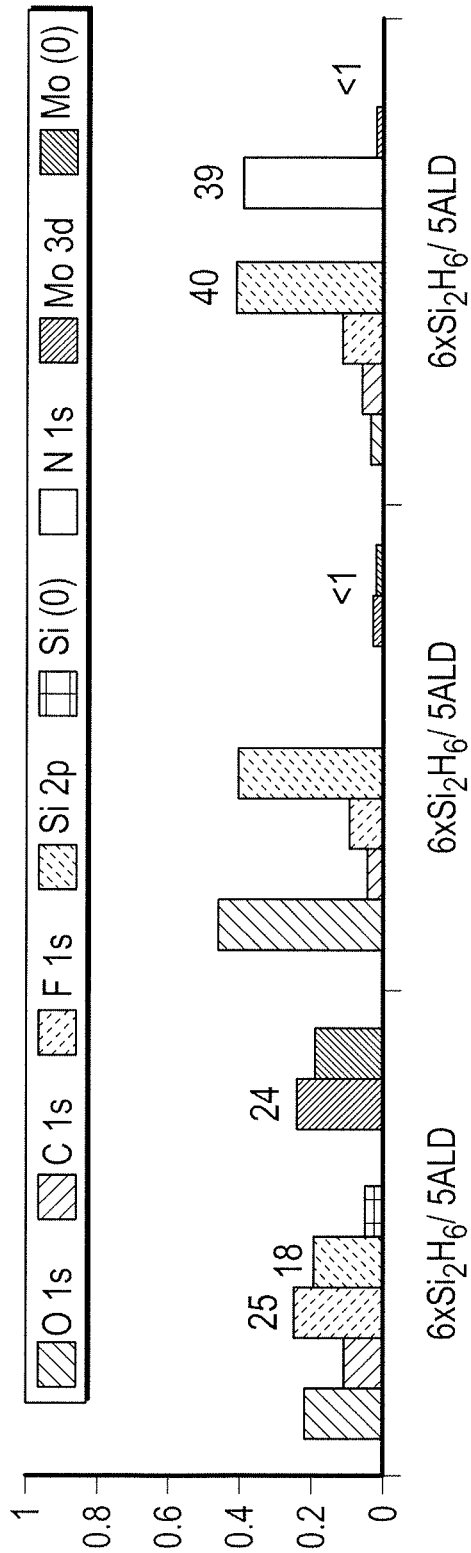
FIG. 4B illustrates XPS chemical composition data of various elements present on different substrate types after 5 ALD cycles according to an embodiment described herein.
Figure 4C:
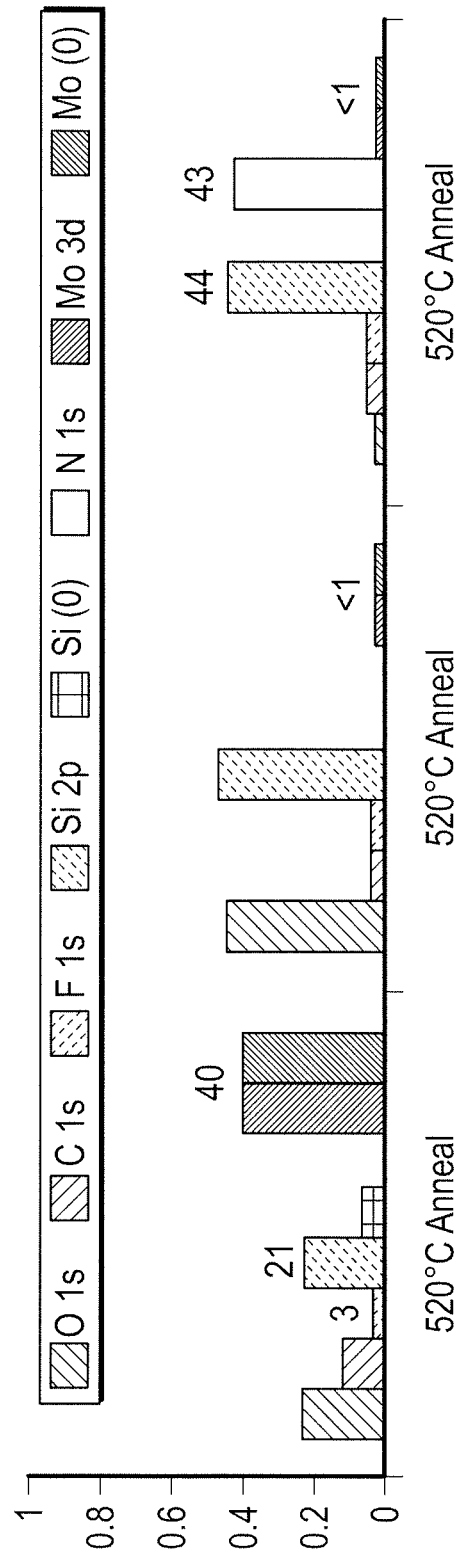
FIG. 4C illustrates XPS chemical composition data of the substrates of FIG. 4B after an annealing process according to an embodiment described herein.

FIGS. 4A-4C illustrate XPS chemical composition data of selective $MoSi_x$ deposition on HF cleaned Si, $SiO_2$, and SiON with a post deposition anneal. FIG. 4A illustrates XPS chemical composition of Si, $SiO_2$, and SiON substrates after the HF clean. FIG. 4B illustrates XPS chemical composition data showing the $MoSi_x$ was selectively deposited only on Si after the 5 ALD cycles of $MoSi_x$ followed by the additional 6 pulses (25.2 MegaL) of $Si_2H_6$ at 120° C. FIG. 4C illustrates XPS chemical composition data of the substrates with a post-deposition anneal (PDA) performed at 520° C. for 3 mins. As illustrated, the PDA removed F from the $MoSi_x$ film and reduced the Mo to $Mo^0$.

FIG. 4A illustrates that the SiON surface is composed primarily of $SiN_x$ after the HF clean. After the 5 cycles of $MoSi_x$ ALD followed by an additional 25.2 MegaL of $Si_2H_6$, there was 24% Mo and 18% Si on HF cleaned Si while less than 1% Mo was detected on the $SiO_x$ and $SiN_x$ surfaces as shown in FIG. 4B. Subsequently, the three substrates were annealed at 520° C. for 3 minutes which decreased F from 25% to 3% on the Si substrate. The 520° C. PDA also reduced the Mo to $Mo^0$ on the Si substrate and decreased the Si:Mo ratio from about 0.75 to about 0.5 at the surface. This is consistent with the desorption of surface F in the form of $SiHF_3$ or $SiF_4$. The XPS analysis of the PDA indicates that the F is removed from the film by the PDA which reduces the probability of F diffusion into adjacent MOSFET device structures.

Using an in-situ STM and ex-situ atomic force microscopy (AFM), the surface topographies were investigated after the deposition and the PDA on the Si and $SiO_2$ substrates. A separate substrate of HF cleaned Si after 20 cycles of $MoF_6$ and $Si_2H_6$ was prepared for the in-situ STM. The STM data indicated that the $MoSi_x$ film was atomically flat and conformal with an RMS roughness of about 2.8 Å. The aforementioned substrate was annealed in-situ at 500° C. for 3 mins in the ultra-high vacuum chamber at a pressure of about $5.0 \times 10^{-10}$ Torr. After the 500° C. anneal, the film became flatter with an RMS roughness of about 1.7 Å.

Another substrate of MoSi$_x$/HF cleaned Si after 5 ALD cycles at 120° C. followed by an in-situ 550° C. anneal was taken into an ex-situ furnace for a 900° C. spike anneal in 5% H$_2$ balanced with N$_2$. After the 900° C. spike anneal, AFM was used to obtain the surface morphology. The film retained a sub-nanoscale RMS roughness of 4.75 Å demonstrating that the MoSi$_x$ film has high thermal stability up to about 900° C.

Ex-situ AFM image data of the SiO$_2$ substrate surface after dosing 5 ALD cycles at 120° C. followed by an in-situ 550° C. anneal for 3 minutes in order to confirm the selectivity was performed by counting the number of nuclei on the substrate surface. The density of nuclei was about 9 nuclei/µm$^2$ which confirms the Si deposition preference over SiO$_2$. It is believed that the high deposition selectivity of the embodiments described herein is further improved by controlling wall temperature of the reaction chamber and by using short high pressure Si$_2$H$_6$ pulses and longer purge cycles to facilitate ALD and avoid a CVD deposition regime.

Figure 5A:
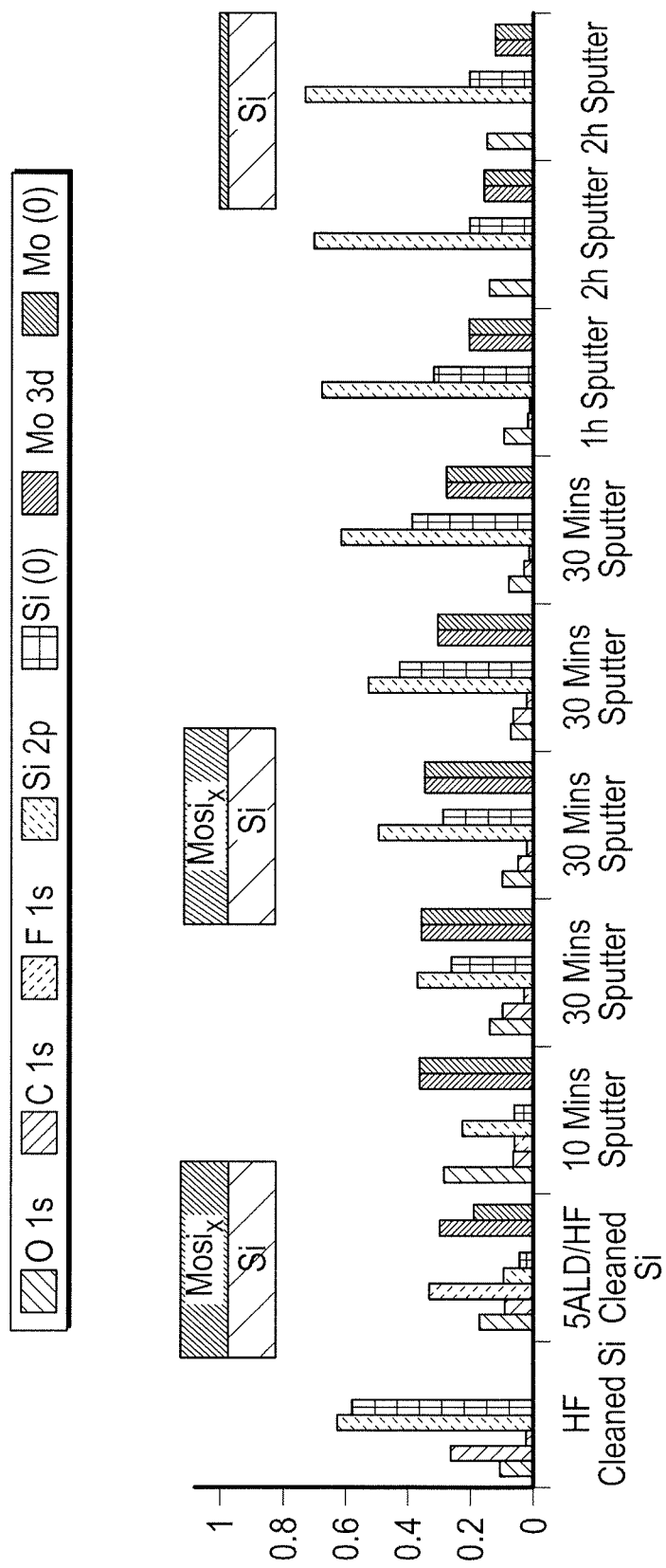
FIG. 5A illustrates XPS depth profiling data of a $MoSi_x$ film after Ar sputtering according to an embodiment described herein.
Figure 5B:
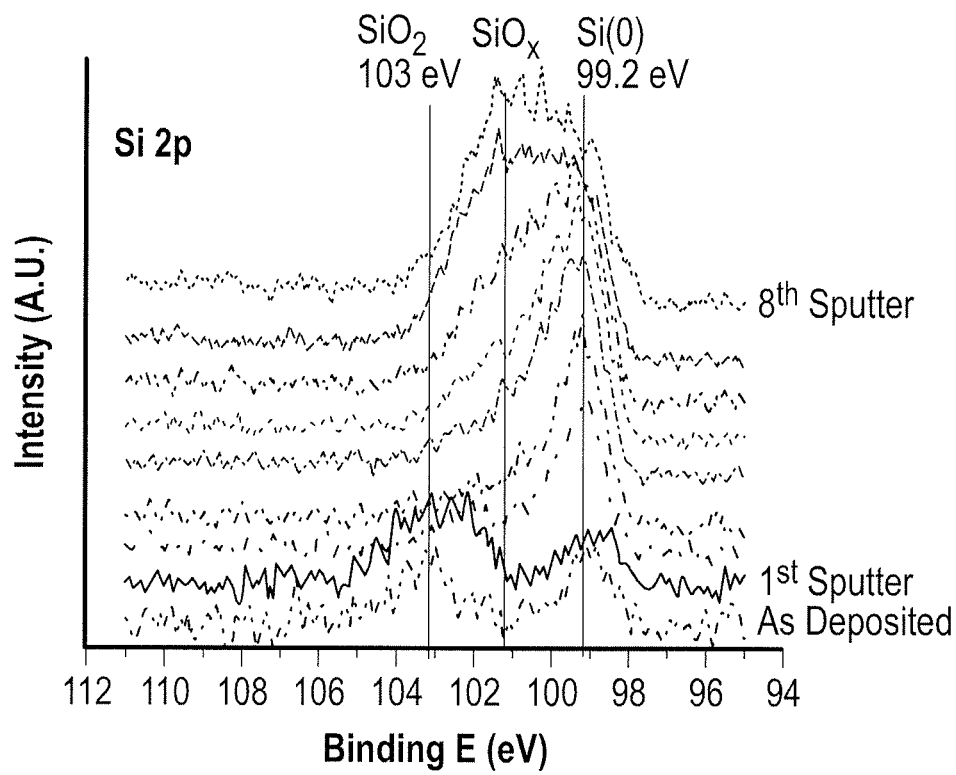
FIG. 5B illustrates XPS chemical composition data of the $MoSi_x$ film according to an embodiment described herein.
Figure 5C:
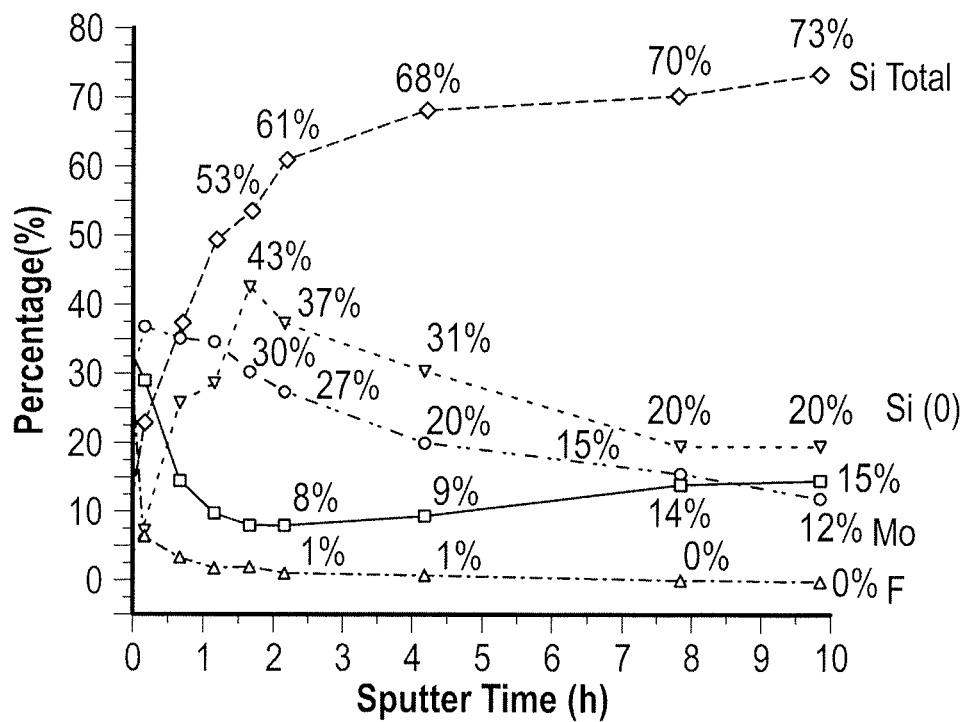
FIG. 5C illustrates data representative of the chemical composition of the $MoSi_x$ film versus time according to an embodiment described herein.

A depth profile study was also performed to determine the internal composition of the MoSi$_x$ film. FIG. 5A illustrates XPS chemical composition data after Ar$^+$ sputtering on HF cleaned Si after the 5 cycles of MoF$_6$ and Si$_2$H$_6$ at 120° C. FIG. 5B illustrates XPS peaks of Si 2p after sequential Ar$^+$ sputtering, the results of which show that the bulk of the MoSi$_x$ film consisted mostly of Si$^0$. FIG. 5C illustrates chemical composition data of the deposited film plotted versus Ar$^+$ sputter time on Si after 5 cycles of MoF$_6$ and Si$_2$H$_6$ at 120° C.

The XPS data shown in FIG. 5A was derived from the MoSi$_x$ film deposited on a HF cleaned Si substrate at 120° C. using 5 ALD cycles of MoF$_6$ and Si$_2$H$_6$ without additional Si$_2$H$_6$ incorporation. As the sputtering time increased, the MoSi$_x$ film became thinner until the underlying Si substrate was exposed. The first 10 mins of sputtering decreased the F from 35% to 8% while the Mo shifted from a mixture of oxidized Mo and Mo$^0$ to pure Mo$^0$. The data is consistent with the surface F being bonded primarily to Mo.

Following consecutive sputtering cycles, the amount of Si increased and the amount of Mo decreased. Furthermore, the amount of Si$^0$ increased together with the total Si and reached a maximum at 43% after 100 mins of a total sputtering time. The Si$^0$ to Mo$^0$ ratio was employed to distinguish the pure MoSi$_x$ phase because, in the pure MoSi$_x$ phase, both Mo and Si are bonded to each other and have an oxidation state of 0. After removal of the silicon oxide and MoF$_x$ species at the substrate surface, the percentage of Si$^0$ exceeded that of Mo$^0$. The Si$^0$:Mo$^0$ ratio in the bulk of the MoSi$_x$ film was 1.41 which corresponds to a Si-deficient MoSi$_x$ film. It is noted that in the center of the film the Si:Mo ratio is 1.77 therefore, in the absence of background O$_2$/H$_2$O, it is possible the Si$^0$:Mo$^0$ ratio would be closer to 2.

FIG. 5B illustrates the raw XPS spectra of Si 2p corresponding to each XPS measurement of FIG. 5A. The Si peak at 99.2 eV increased and broadened to higher binding energy after the 4$^{th}$ sputtering cycle. In contrast, the energy of the Mo peak corresponded to Mo$^0$ after each sputtering cycle. Thus it is believed that the bulk MoSi$_x$ film is predominantly Si$^0$ and Mo$^0$ in the form of MoSi$_x$ while the top surface and the bottom interface was rich in SiO$_x$. The top SiO$_x$ is consistent with contamination from the chamber environment while the bottom interfacial oxide is consistent with the imperfect ex-situ HF clean.

The sub-stoichiometric oxide at the bottom interface did not affect the deposition and film quality indicating that the selectivity of the MoSi$_x$ ALD is sensitive to the quality of the SiO$_2$. FIG. 5C illustrates the percentages of the chemical components obtained from the XPS measurement in FIG. 5A. After the second sputtering cycle (40 mins of total sputtering time), F decreased to below 3% and eventually reached 0%. O in the bulk of the film was <10% but slowly increased to 15% at the MoSi$_x$—Si interface which is consistent with the existence of an interfacial oxide layer.

To understand the effect of the additional Si$_2$H$_6$ doses on the Si:Mo ratio of MoSi$_x$ film, XPS depth profiling was performed on a MoSi$_x$ film which had the additional Si incorporation. An additional 6 pulses (25.2 MegaL) of Si$_2$H$_6$ were dosed at the end of the 5 ALD cycles of MoF$_6$ and Si$_2$H$_6$ at 120° C. followed by an anneal at 530° C. for 3 mins on dry cleaned Si. The post anneal dry clean process described herein utilized a plasma of NF$_3$ and NH$_3$ with Ar as a carrier gas.

Figure 6A:
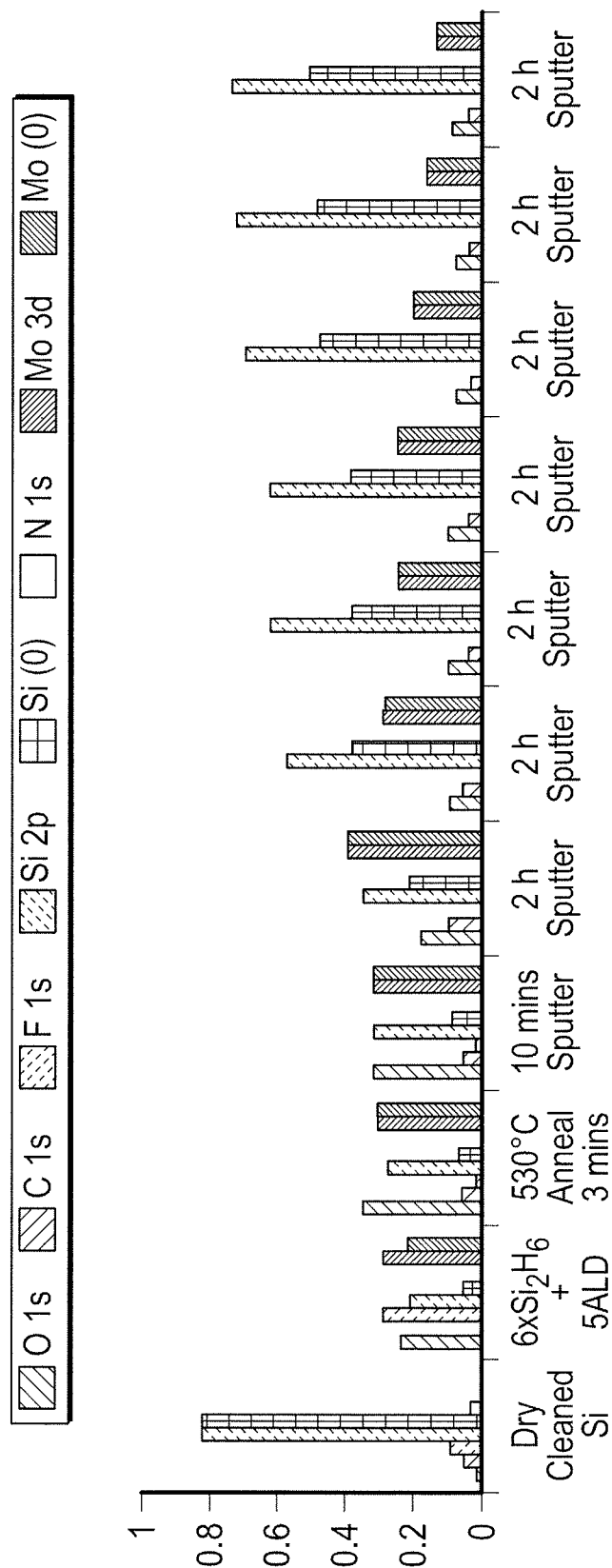
FIG. 6A illustrates XPS depth profiling data of a $MoSi_x$ film after Ar sputtering according to an embodiment described herein.
Figure 6B:
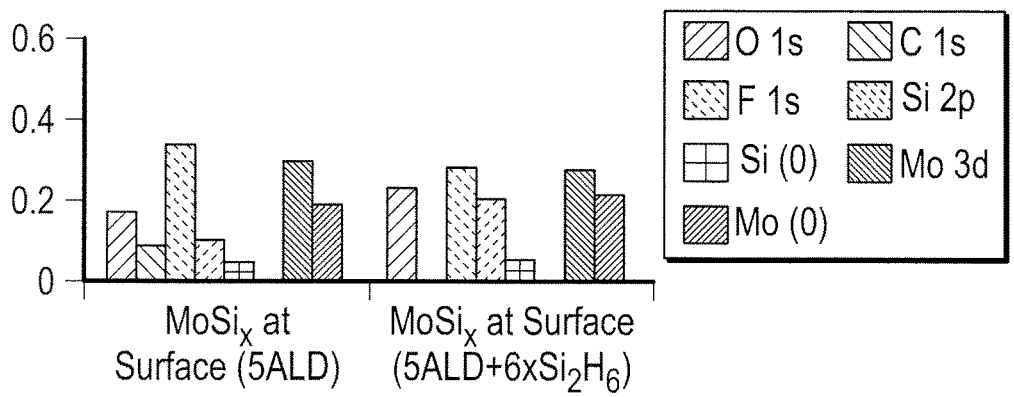
FIG. 6B illustrates surface composition data of a $MoSi_x$ film according to an embodiment described herein.
Figure 6C:
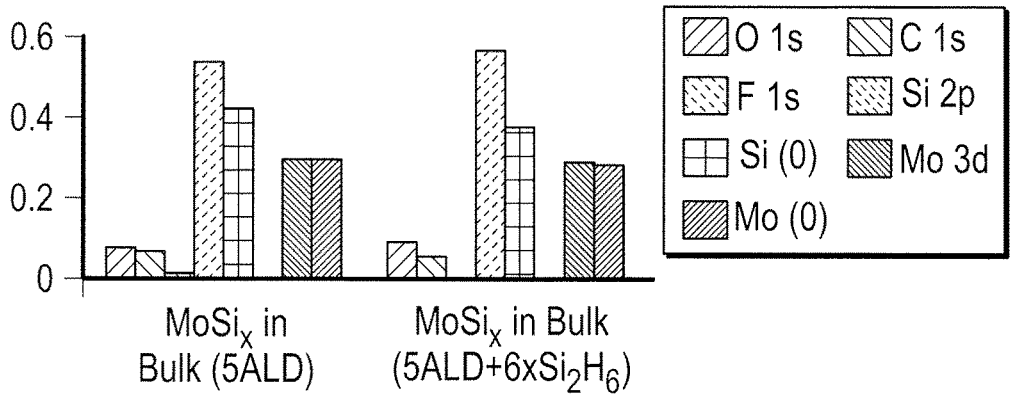
FIG. 6C illustrates bulk composition data of the $MoSi_x$ film of FIG. 6B according to an embodiment described herein.
Figure 6D:
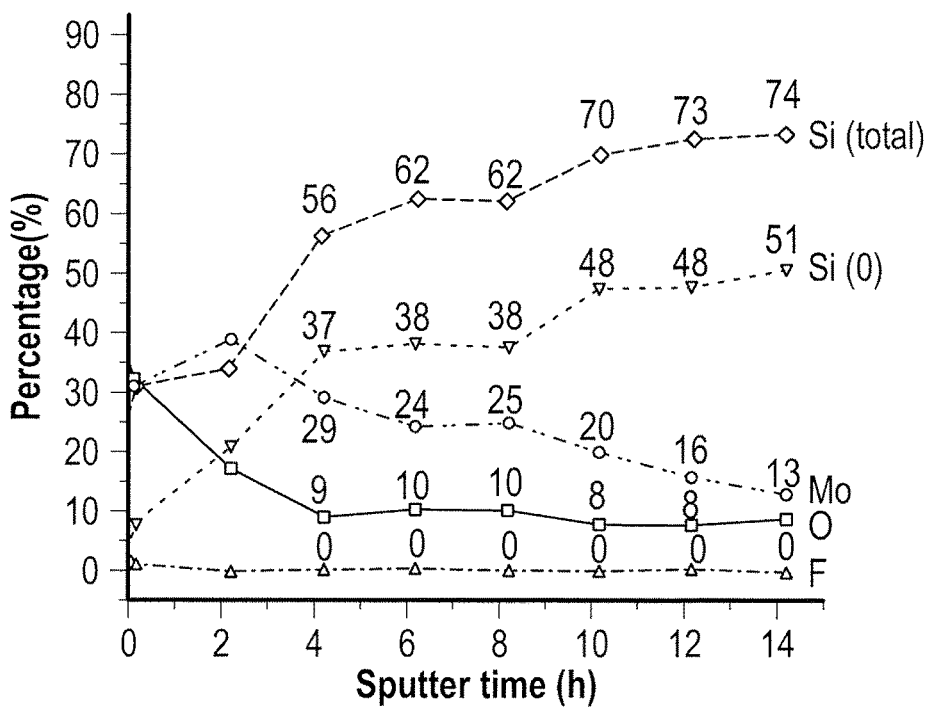
FIG. 6D illustrates data representative of the chemical composition of the $MoSi_x$ film versus time according to an embodiment described herein.

FIGS. 6A-6D illustrate XPS profile data of the MoSi$_x$ film with after exposure to the additional Si$_2$H$_6$ doses. FIG. 6A illustrates XPS chemical composition data after Ar$^+$ sputtering dry cleaned Si after 5 cycles of MoF$_6$ and Si$_2$H$_6$ followed by additional 6 pulses (25.2 MegaL) of Si$_2$H$_6$ at 120° C. FIG. 6B illustrates XPS surface composition data after 5 ALD cycles of MoF$_6$ and Si$_2$H$_6$ with and without extra Si$_2$H$_6$ pulses. Si:Mo ratios were 0.33 for 5 ALD and 0.89 for 5ALD+6×Si$_2$H$_6$ which is consistent with Si incorporation on the surface. FIG. 6C illustrates XPS bulk composition data of MoSi$_x$ with and without extra Si$_2$H$_6$ pulses after removing surface contaminations using the Ar$^+$ sputtering. Si:Mo ratios were 1.77 for 5 ALD and 1.96 for 5ALD+6×Si$_2$H$_6$. FIG. 6D illustrates XPS chemical composition data of the MoSi$_x$ film is plotted versus Ar$^+$ sputter time on Si after 5 cycles of MoF$_6$ and Si$_2$H$_6$ followed by additional Si$_2$H$_6$ pulses at 120° C.

FIG. 6A presents a series of depth-profile XPS after each operation performed on the dry cleaned substrate. After the 6×Si$_2$H$_6$/5ALD cycles, there was 28% F, 20% Si, and 28% Mo at the substrate surface. F on the surface was mostly removed after the 530° C. anneal and the Mo was all reduced to Mo$^0$ which was consistent with the desorption of F from the surface as presented in FIG. 4C. The Si:Mo ratio was 0.89 at this operation. By comparison, the Si:Mo ratio of the MoSi$_x$ film without the extra Si$_2$H$_6$ doses was only 0.33 as illustrated in FIG. 6B.

After removing the surface oxide contamination, the Si$^0$:Mo$^0$ in the bulk was 1.32 (Si:Mo=1.96) for MoSi$_x$ with extra Si$_2$H$_6$ pulses. This was comparable to the Si$^0$:Mo$^0$=1.41 (Si:Mo=1.77) in the bulk of MoSi$_x$ without extra Si$_2$H$_6$ incorporation as depicted in FIG. 6C. Thus, it is believed that the extra Si$_2$H$_6$ pulses increase the Si content at the Si-deficient MoSi$_x$ surface after the ALD cycles. In contrast, the Si:Mo ratios in the bulk of the MoSi$_x$ films were close to stoichiometric MoSi$_2$. FIG. 6D shows the XPS percentage of each chemical component in the function of the Ar$^+$ sputter time which is consistent with the MoSi$_x$ formation in bulk of the MoSi$_x$ film.

In one embodiment, 4.2 MegaL of Si$_2$H$_6$ was introduced to the reaction chamber over a duration of 6 seconds using a pneumatic valve. The Si$_2$H$_6$ process characteristics utilize an approximately 3 times larger Si$_2$H$_6$ exposure over a dosing duration about 10 times shorter than conventional Si$_2$H$_6$ dosing parameters. Thus, embodiments described herein utilize a 30× higher partial pressure during the ALD dose when compared to conventional dosing regimes. The 30× higher instantaneous pressure during dosing is believed to enable a precursor mediated Si$_2$H$_6$ chemisorption layer to remain on the surface long enough to react with the Mo to incorporate more Si into the MoSi$_x$ film. The Si incorporation is also believed to be self-limiting which enables a growth rate of MoSi$_x$ of about 1.2 nm/cycle.

The resistance of the MoSi$_x$ film was measured using a 4-point probe measurement. For the electrical measurement, updoped Si (001) with >10000 ohm·cm resistance was used as a substrate. For the electrical measurement, 10 cycles of MoSi$_x$ ALD at 120° C. was deposited on an HF cleaned intrinsic (semi-insulating) Si substrate followed by an in-situ 550° C. anneal for 3 minutes and a 900° C. spike anneal in 5% H$_2$ balanced in N$_2$. Ni dots were deposited as a probe contact. The resistance was 110 Ohm and, using an infinite sheet approximation, the resistivity was calculated as:

$$\rho = ktR_{max} = (4.53) \times (10 \times 10^{-7}) \times (110) = 498 \ \mu\Omega cm$$

where k is a constant, t is thickness and R$_{max}$ is the measured maximum resistance.

Figure 7:
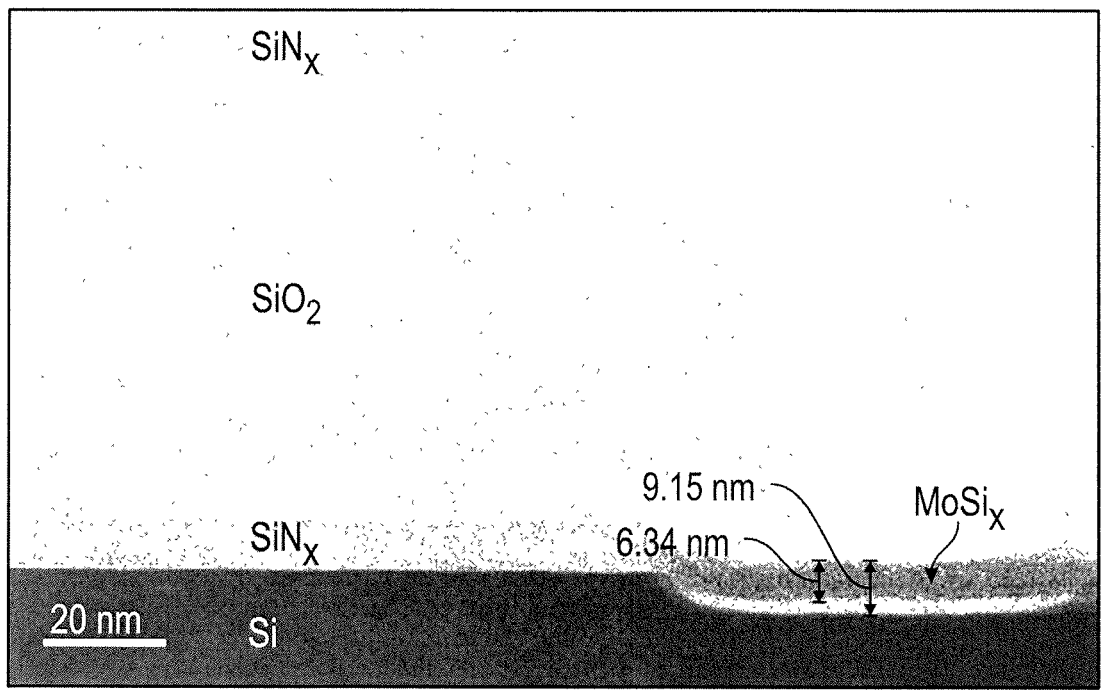
FIG. 7 is a cross-sectional tunneling electron micrograph (TEM) of a $MoSi_x$ film selectively deposited on silicon preferentially to other material present on the substrate according to an embodiment described herein.

A cross-sectional TEM study was performed on the patterned substrate to confirm the selectivity of MoSi$_x$ on the nanostructured pattern. FIG. 7 is a cross-sectional TEM image of the MoSi$_x$/HF cleaned patterned substrate. On the HF cleaned patterned substrate, 5 cycles of MoSi$_x$ ALD followed by an additional 25.2 MegaL of Si$_2$H$_6$ were dosed at 120° C. The elemental composition of this substrate at each deposition step is shown in FIGS. 3A-3C. The TEM image shows complete selectivity of MoSi$_x$ deposition on Si but not on SiN$_x$ nor SiO$_2$. The thickness of the MoSi$_x$ film deposited on Si was about 6.3 nm after the 5 ALD cycles followed by an additional 25.2 MegaL which achieved a growth rate of about 1.2 nm/cycle. Due to the growth rate per cycle of MoSi$_x$ ALD, 5 ALD cycles is believed to be sufficient for contact materials and contact device structures.

Selective atomic layer deposition of sub-stoichiometric MoSi$_2$ was achieved by a selective process on hydrogen-terminated Si versus thermally grown SiO$_2$, ion damaged SiON, and SiN$_x$. The selectivity is based on the favorable reactivity of MoF$_6$ and Si$_2$H$_6$ on H—Si but not on SiO$_2$ or SiN$_x$ since Si—O, Si—N, and SiO—H bonds are strong enough that they cannot be cleaved by either precursor at 120° C. Both MoF$_6$ and Si$_2$H$_6$ showed self-limiting behavior which allowed deposition of a highly conformal and smooth film with a root mean square (RMS) roughness of 2.8 Å. PDA in ultra-high vacuum at a temperature of between about 500° C. and 550° C. for 3 minutes further decreased the RMS roughness to 1.7 Å. The quality of the MoSi$_x$ film was preserved even after a 900° C. spike anneal in an H$_2$/N$_2$ environment which is consistent with high thermal stability.

A depth profiling XPS study revealed that the bulk of the MoSi$_x$ film is close to stoichiometric MoSi$_2$ (Si:Mo=1.7-1.9) with <10% oxygen and fluorine. The surface of the MoSi$_x$ film after 5 ALD cycles showed a highly Si-deficient MoSi$_x$ surface with Si:Mo ratio of 0.33 and this Si:Mo ratio at the surface is improved to 0.89 by pulsing extra Si$_2$H$_6$. The cross-sectional TEM imaging shows that the selectivity is retained on the nanoscale and that MoSi$_x$ can be selectively deposited on Si without substrate consumption.

The MoSi$_x$ film growth rate of about 1.2 nm/cycle enables less than 10 ALD cycles, such as 5 ALD cycles, to be sufficient for utilization of the MoSi$_x$ film as a contact material. Accordingly, process throughput is increased by utilizing the embodiments described herein when compared to conventional ALD processes. It is believed the selective MoSi$_x$ deposition eliminates or substantially reduces reliance on lithography processes for complicated 3D MOSFET structures (e.g FinFETs). The selectivity for Si—H bonds vs SiO—H bonds exceeds $10^6$. Thus, high selectivity is possible on the nanoscale even without the use additional passivation layers. The embodiments described herein also illustrate that ALD of silicide versus metal could readily be switched while retaining selectivity by changing the partial pressure during the ALD pulse of the reductant.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   heating a substrate having a silicon containing surface to a first temperature;
   exposing the substrate to a plasma comprising hydrogen, wherein the plasma comprising hydrogen is formed from one or more precursors selected from the group consisting of NF$_3$, NH$_3$, and H;
   exposing the substrate to a first dosage of a MoF$_6$ precursor;
   exposing the substrate to a second dosage of a Si$_2$H$_6$ precursor;
   sequentially cycling the exposing the substrate to a first dosage and the exposing the substrate to a second dosage; and
   after the sequential cycling, exposing the substrate to a third dosage of the Si$_2$H$_6$ precursor.

2. The method of claim 1, further comprising:
   annealing the substrate after the exposing the substrate to a third dosage at a second temperature of between about 500° C. and about 550° C.

3. The method of claim 1, wherein the first temperature is between about 100° C. and about 150° C.

4. The method of claim 1, wherein the sequential cycling is performed less than 10 times.

5. The method of claim 4, wherein the sequential cycling is performed 5 times.

6. The method of claim 1, wherein a nitrogen purge process utilizing N$_2$ is performed during the sequential cycling.

7. The method of claim 1, wherein the first dosage is performed for a duration of between about 10 ms and about 100 ms.

8. The method of claim 7, wherein the first dosage comprises a MoF$_6$ flow rate of between about 1 MegaL and about 10 MegaL.

9. The method of claim 7, wherein the second dosage is performed for a duration of between about 1 ms and about 50 ms.

10. The method of claim 9, wherein the second dosage comprises a Si$_{-2}$H$_6$ flow rate of between about 1 MegaL and about 10 MegaL.

11. The method of claim 10, wherein the third dosage comprises a Si$_2$H$_6$ flow rate of between about 20 MegaL and about 50 MegaL.

12. The method of claim 11, wherein the third dosage comprises between about 3 pulses and about 10 pulses of Si$_2$H$_6$.

13. The method of claim 1, further comprising:
   selectively depositing a MoSi$_x$ film on the silicon containing surface at a growth rate of about 1.2 nm per sequential cycle.

14. A substrate processing method, comprising:
   positioning a substrate on a heater in a reaction chamber having chamber walls;
   heating the substrate on the heater to a first temperature;
   maintaining the chamber walls at a second temperature less than the first temperature;

exposing a silicon containing surface of the substrate to hydrogen, wherein the exposing a silicon containing surface of the substrate comprises exposing the silicon containing surface to either of a plasma formed from $NF_3/H_2$ gases or a plasma formed from $NF_3/NH_3$ gases;

exposing the substrate to a first dosage of a $MoF_6$ precursor;

exposing the substrate to a second dosage of a $Si_2H_6$ precursor;

sequentially cycling the exposing the substrate to a first dosage and the exposing the substrate to a second dosage; and after the sequential cycling, exposing the substrate to a third dosage of the $Si_2H_6$ precursor.

15. The method of claim 14, wherein the first temperature is between about 100° C. and about 150° C. and the second temperature is between about 65° C. and about 85° C.

16. The method of claim 14, wherein the first dosage comprises a $MoF_6$ flow rate of between about 1 MegaL and about 10 MegaL, the second dosage comprises a $Si_2H_6$ flow rate of between about 1 MegaL and about 10 MegaL, and the third dosage comprises a $Si_2H_6$ flow rate of between about 20 MegaL and about 50 MegaL.

17. The method of claim 14, further comprising:

selectively depositing a $MoSi_x$ film comprising $MoSi_2$ on the silicon containing surface at a growth rate of about 1.2 nm per sequential cycle.

18. A substrate processing method, comprising:

heating a substrate to a first temperature;

exposing a silicon containing surface of the substrate to a hydrogen containing plasma, the hydrogen containing plasma formed from one or more of an $NF_3$ precursor, and $NH_3$ precursor, and a precursor consisting of H;

exposing the substrate to a first dosage of a MoF6 precursor; exposing the substrate to a second dosage of a Si2H6 precursor; sequentially cycling the exposing the substrate to a first dosage and the exposing the substrate to a second dosage;

after the sequential cycling, exposing the substrate to a third dosage of the Si2H6 precursor; and annealing the substrate after the exposing the substrate to a third dosage at a second temperature of between about 500° C. and about 550° C.

* * * * *